United States Patent [19]

Pinder

[11] Patent Number: 5,864,752
[45] Date of Patent: Jan. 26, 1999

[54] RADIO SCAN METHOD WITH SPATIAL CHANNEL MARKING

[75] Inventor: Ellis A. Pinder, Davie, Fla.

[73] Assignee: Motorola, Inc., Schaumburg, Ill.

[21] Appl. No.: 939,285

[22] Filed: Sep. 29, 1997

[51] Int. Cl.$^6$ .................................................. H04B 1/18
[52] U.S. Cl. .................................. 455/161.3; 455/166.1; 455/186.1; 455/226.2; 455/516; 455/174.1
[58] Field of Search .......................... 455/161.1, 161.2, 455/161.3, 166.1, 166.2, 179.1, 182.1, 184.1, 185.1, 186.1, 226.1, 226.2, 227, 229, 105, 455, 450, 509, 464, 516, 62, 164.1, 164.2, 182.2, 192.1, 192.2, 174.1, 194.1, 218, 212, 177.1

[56] References Cited

U.S. PATENT DOCUMENTS 4,513,443  4/1985  Louttit ................................. 455/166.1
5,199,109  3/1993  Baker .................................... 455/161.3

*Primary Examiner*—Doris H. To
*Attorney, Agent, or Firm*—Frank M. Scutch, III

[57] ABSTRACT

A method used with spatial channel marking in a radio scanning technique that extends the conventional methods of channel marking to include information about the source of the signal. This information is stored on a per-channel basis whenever a mark is placed on a channel. On successive visits to a marked channel, a determination is made whether the source of the signal has changed. If a change is detected, the channel is immediately unmarked and a decode begins, even through a carrier may still be present. This provides for situations when an associated group member using a two-way radio begins transmitting while a radio of another group is transmitting and keeping the channel marked. An unsuccessful decode will result in re-marking and an update of the source information.

8 Claims, 4 Drawing Sheets

RADIO SCAN METHOD WITH SPATIAL CHANNEL MARKING

TECHNICAL FIELD

This invention relates in general to two-way radio and more particularly frequency scanning using a two-way radio.

BACKGROUND

Radio scanning is typically an option included in a two-way radio that enables the user to rapidly receive or scan multiple frequencies in a predetermined order. This enables more than one frequency or channel to be monitored for incoming voice or data enabling the two-way radio to be versatile.

It is highly desirable for two-way radio equipment that utilizes a conventional scanning technique to scan radio channels at the fastest rate possible. This avoids lost syllables during speech and prevents "audio holes" or gaps of speech from being missed. If the radio must decode subaudible signaling, scan performance becomes degraded whenever "unqualified" channel activity is detected because the radio must spend up to 200 ms decoding the signaling. This problem is even further exacerbated when the radio operates primarily on a fixed set of itinerant or consumer channels. These channels are highly utilized especially in urban or industrial environments, and this increases the chance of scan-degrading unqualified channel activity. With regard to most commonly used conventional scanning techniques, these techniques operate by iteratively checking each channel in a list for a carrier.

As seen in prior art FIG. 1, the scanning sequence starts 101 where the receiver is set up on each specific channel 103. If no radio frequency (RF) carrier 105 is detected, the next channel is selected 107 and the receiver is configured for the next channel 103 in the list. Channels are scanned iteratively 103, 105, 107 from a list until a carrier is detected. Upon completion of scanning the list, the list is reset and scanning continues from the top of the list. If an RF carrier signal is detected 105, the receiver checks for a valid subaudible code 109 such as a private line (PL) or digital private line (DPL) multi-frequency tone. If no subaudible code is detected 111 the process begins again by selecting the next channel to scan 107. In the event that the proper subaudible squelch code is detected 111, the receiver is unmuted 113 and the proper information is received until no further RF carrier signal or subaudible code is present. After no further RF carrier signal or subaudible is present, the next channel in the scan sequence is selected 107.

Additionally in prior art FIG. 2, another conventional scan technique utilizes subaudible squelch coding and channel marking 200. Channel marking is used to "mark" a channel with an RF carrier and a non-matching subaudible squelch code, so future scans of a marked channel will not incur the delay associated with decoding the subaudible signaling. A loss of the RF carrier on a marked channel will cause the channel to become "unmarked," whereby full decoding will take place followed by a decision whether to receive the information. A counter for each channel keeps track of how many times the channel is "skipped" if it is marked, and if a limit is reached, that particular channel is unmarked. Those skilled in the art will appreciate the improved scan performance associated with this technique. In this technique, the scanning sequence starts 201 by setting up the receiver on the specific receiving channel 203. If no RF carrier 205 is detected the radio checks a list to determine if it is marked 207. If the channel is not marked, the next subsequent channel in the scan sequence is selected 209. If however, the channel is marked the proper steps are taken to unmark the channel 211 and clear the marked channel counter.

If an RF carrier is detected 205, a determination is again made as to whether the channel is marked 213. If the channel is marked a channel marking counter is incremented 215 for that channel and a comparison is made 217 to determine if a limit has been reached. If no mark limit has been reached the next channel in the scanning sequence 209 is selected. If however, the mark limit has been reached the mark and mark limit counter is cleared 221 and any associated signaling information is subsequently decoded 219. Thereafter, if no signaling information 223 is detected the channel is marked 225 and the next channel is selected in the scan sequence 209. If signaling information is detected, the data is received or the receiver is unmuted 227 until no further channel activity is detected 229.

If a carrier is detected, the radio will pause on that channel and will attempt to decode the private line (PL), digital private line (DPL) code or other signaling information. If the correct detection is made, the message will be received or the receiver unmuted; otherwise, the radio will resume scanning. If there are large quantities of "unqualified" activity, that is channel activity with a missing or non-matching signaling code, scan performance will seriously be degraded. This is due to the fact that the radio must continually stop on each channel and perform the time-consuming task of checking for subaudible signaling information. Previous radio scanning techniques have improved performance by "marking" a specific channel that has unqualified activity. This ultimately works to prevent unnecessary PL decodes. The scanning controller or "executive" simply checks the marked channel for loss of a carrier. When such a transition is detected, the channel is unmarked, so additional activity receives a full decode attempt.

Users of radios on business frequencies often work in small groups within a confined geographical area, such as a warehouse. It is not uncommon for such a group of people to be within the receiving range of another group legally assigned the same frequency. Typically the two groups will not interfere with each other due to selection of different subaudible squelch codes, but such interference can degrade scan performance, even with channel marking. Channel activity from another group using a different code will cause a scanning radio to mark a channel, which will cause a latency in receiving a valid transmission. The worst case involves the receipt of a valid message just after a channel has been marked from a user of another group. The valid message will not be received until the mark limit counter reaches its limit, which forces a decode. If the message is short, the message may not be received at all. Reducing the mark limit counter will reduce the latency, but will degrade scan performance.

Thus the need exists to provide a radio scanning method that utilizes a channel marking scheme for scanning efficiency but provides a means to minimize message latency on channels likely to have an abundance of unqualified activity.

SUMMARY

The invention encompasses a method of scanning a number of predetermined radio frequencies in a radio receiver that includes the steps of: a) monitoring for detection of a radio frequency (RF) carrier signal; b) detecting the presence of a flag marker associated with the RF carrier signal; c) monitoring for detection of a code associated with the RF carrier signal; d) storing a first signal measurement representing the signal strength of the RF carrier signal in a predetermined memory location; e) comparing a subsequent signal measurement of the RF carrier signal with the first signal measurement; f) repeating steps a) through c) and step e) in a scanning sequence; g) disallowing the receipt of received information in at least one iteration of the scanning sequence if steps a) though b) have been satisfied and the first signal measurement is substantially equal to any subsequent signal measurements, and h) allowing received information associated with the RF carrier signal to be received once the first signal measurement is substantially dissimilar to at least one subsequent signal measurement.

Further, the present invention includes a method of channel mark scanning a plurality of marked radio channels and unmarked radio channels in a radio receiver. This method includes the steps of receiving an RF carrier signal on an unmarked radio channel; decoding any subaudible signaling information on the unmarked radio channel; comparing the subaudible signaling information with preselected signaling information; marking the unmarked radio channel with a channel marking flag if there is no match with the preselected signaling information; measuring the RF signal strength of the RF carrier signal to provide a measured signal strength value; storing the measured signal strength value in a memory for the marked channel; measuring the signal strength of the RF carrier signal to provide a subsequent signal strength value upon any subsequent visits to the marked radio channel if it remains marked; comparing the measured signal strength value with the subsequent signal strength value for determining if there is an appreciable difference; unmarking the marked radio channel if an appreciable difference exists; and receiving any subaudible signaling information that may exist on the unmarked radio channel.

Moreover, the invention further includes a method for scanning a predetermined number of frequencies in a radio receiver comprising the steps of a) monitoring for detection of a radio frequency (RF) carrier signal; b) detecting the presence of a channel marking bit defining a marked channel associated with the RF carrier signal; c) measuring the signal strength of the RF carrier signal to provide a measured signal strength value if the radio channel is a marked channel; d) storing the measured signal strength value in a memory for the marked channel; e) measuring the signal strength of the RF carrier signal to provide a subsequent signal strength value upon any subsequent scanning visits to the marked radio channel if the channel marking bit remains on the channel; f) comparing the measured signal strength value with the subsequent signal strength value for determining if there is a substantial difference; g) unmarking the marked radio channel if a substantial difference exists in signal strength; h) receiving any subaudible signaling information that may exist; and i) permitting received information associated with the RF carrier, if detected, to be received.

DETAILED DESCRIPTION OF THE PREFERRED EMBODIMENT

Figure 1:
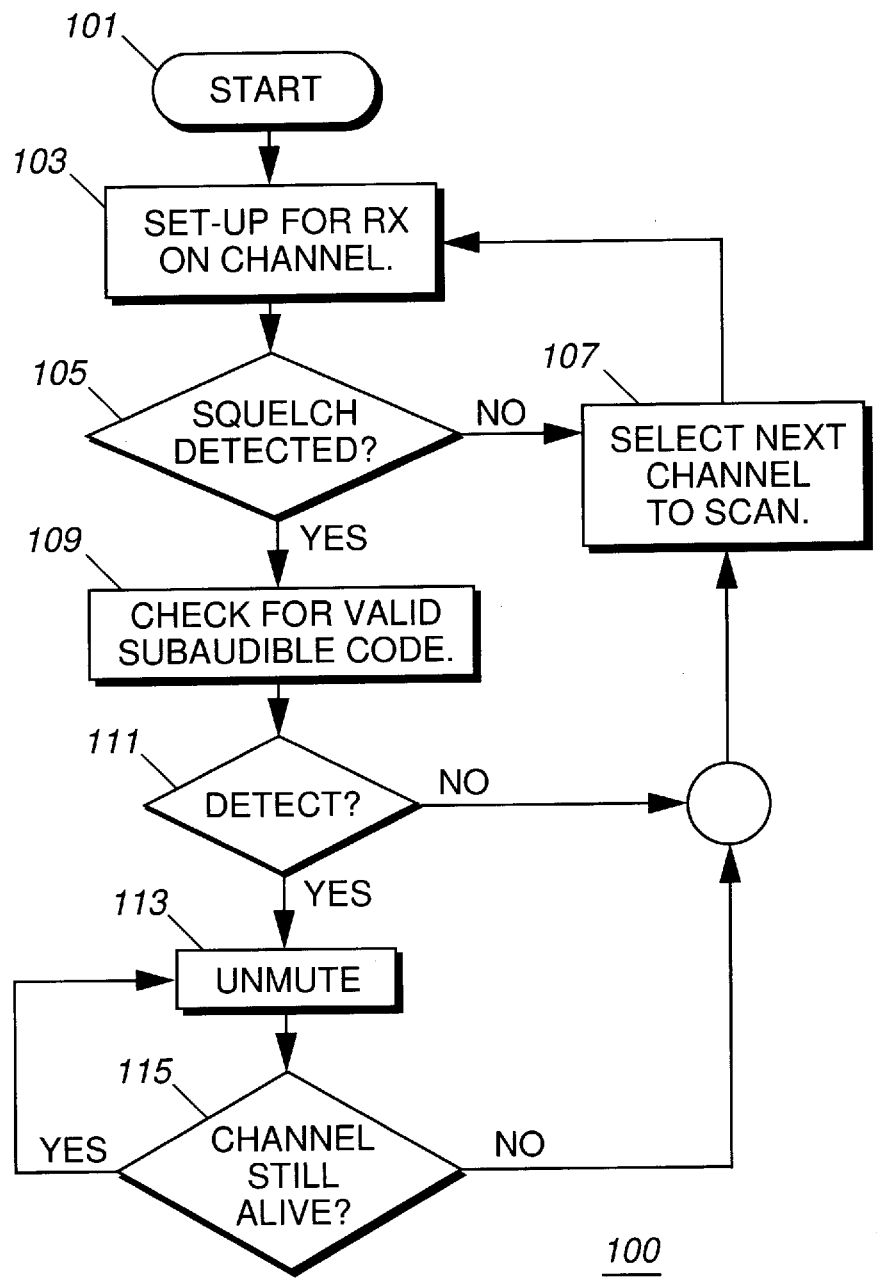
FIG. 1 is a prior art flow chart diagram showing a conventional scan technique utilizing subaudible channel marking and having no enhancements.
Figure 2:
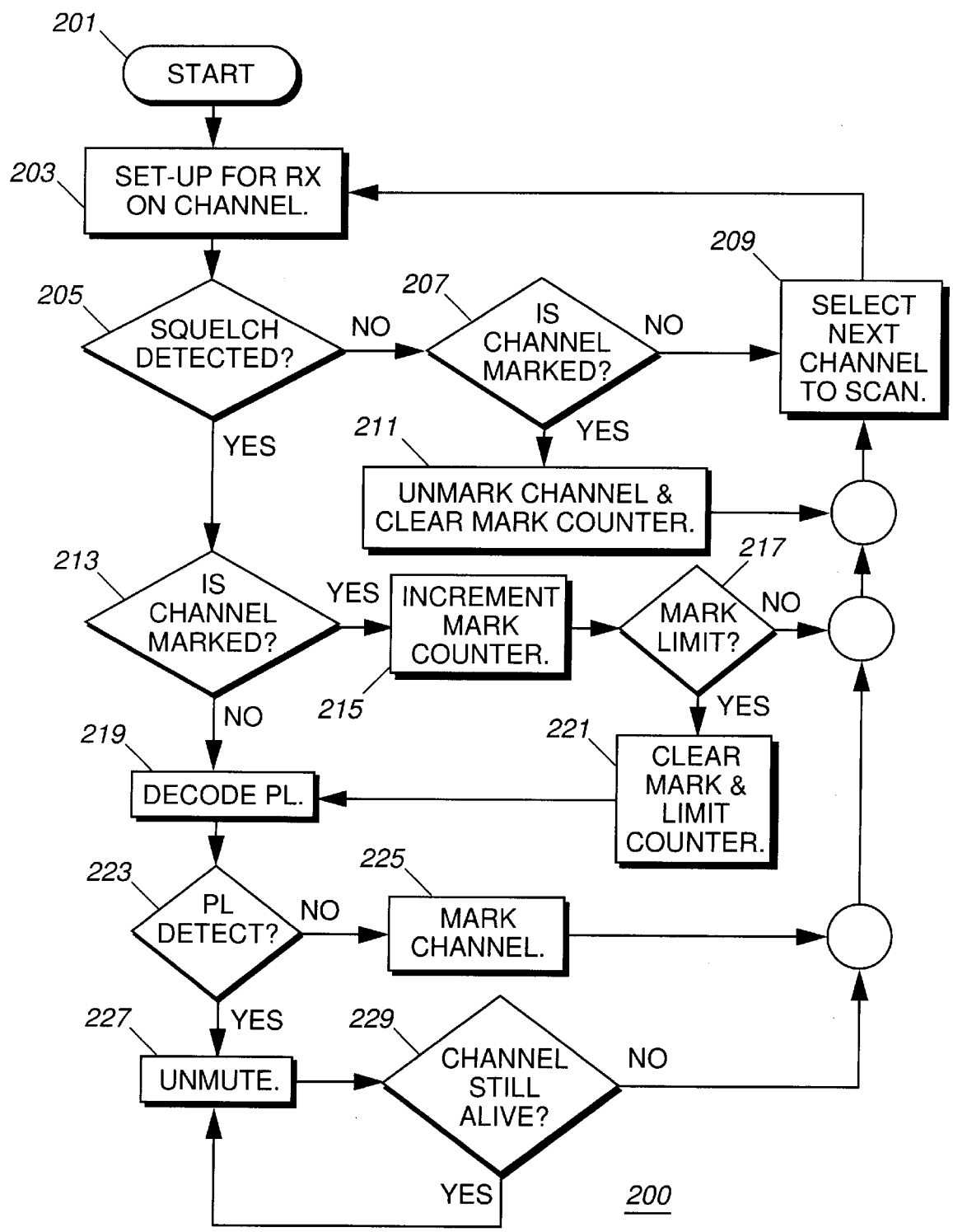
FIG. 2 is a prior art flow chart diagram showing a conventional scan technique utilizing subaudible channel marking and channel marking.
Figure 3A:
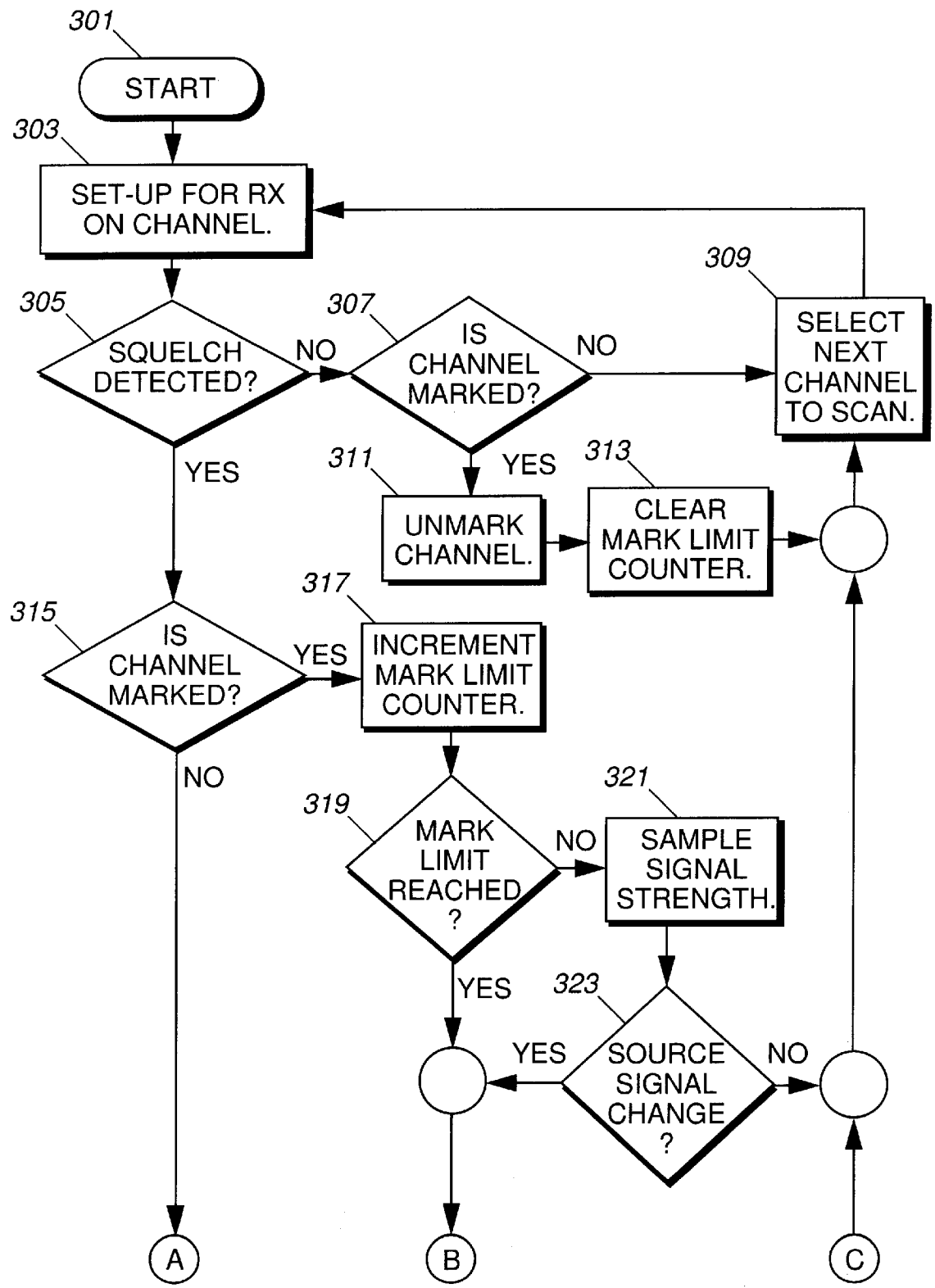
FIGS. 3A–3B are flow chart diagrams according to the present invention showing a scan technique utilizing subaudible signaling information such as private line (PL) and enhanced channel marking.
Figure 3B:
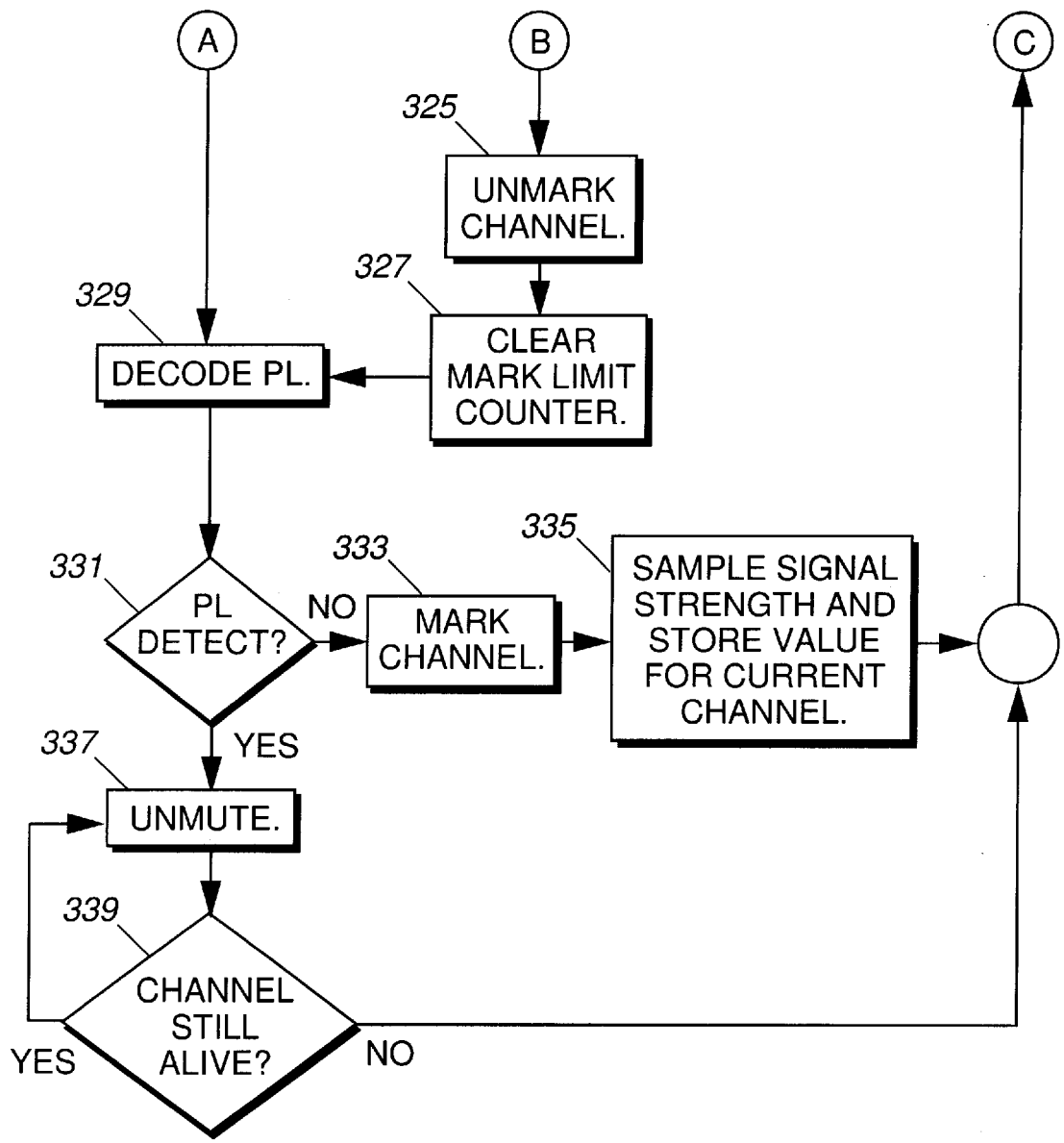

Referring now to FIG. 3, a radio scan method with spatial channel marking 300 includes starting the scan process 301 while setting up the receive channel for scanning operation 303. If no radio frequency (RF) carrier squelch signal is detected 305 a determination is made as to whether the receive channel is marked 307. If the receive channel is not marked, the next channel in the scan sequence is selected 309. If the channel is marked, appropriate steps are taken to unmark the channel 311 whereby a mark limit counter is cleared 303 and the next channel in the scan sequence is selected 309.

If an RF carrier squelch signal is detected and the channel is marked 315 a mark limit counter is incremented 317 and a determination is made if the mark limit has been reached 319. If the mark limit has not been reached, a sample of the signal strength of the RF carrier signal is made 321 and a determination is made if this change in signal strength 323 denotes a change in the RF carrier source. If the RF carrier source is different, which suggests that a different radio may be transmitting, the channel is unmarked 325 and the marked channel counter is cleared 327. If however it is the same source, the next channel in the scanning sequence is selected 309.

If it is initially determined that the channel is unmarked 315 or after the mark limit counter is cleared 327 any included signaling information is decoded 329 and a determination is made if the desired signaling information is detected 331. If the desired signaling information is not detected 331, the channel is marked 333, the sample of the signal strength 321 is converted to a value that can be stored for the current channel. Thereafter, the next channel in the scanning sequence is selected 309. If however the correct signaling information is detected 331, data is received or the channel is unmuted 337 until no further channel activity is detected 339. Thereafter, the next channel in the scanning sequence may again be selected 309.

Thus, the present invention extends the conventional methods of channel marking to include information about the source of the signal. This information is stored on a per-channel basis whenever a mark is placed on a channel. On successive visits to a marked channel, a determination is made whether the source of the signal has changed. If a change is detected, the channel is immediately unmarked and a decode begins, even through a carrier may still be present. This provides for the case when an associated group member begins transmitting while a radio of another group is transmitting and keeping the channel marked. An unsuccessful decode will result in re-marking and an update of the source information.

The source information in the preferred embodiment is signal strength provided by an Radio Signal Strength Indication (RSSI) circuit. The communication range of the radio can be divided into two or more areas, with some signal strength threshold separating the ranges. Typically, two ranges would be used. It is well understood by those skilled in the art that a number of circumstances or factors can affect a signal strength reading, so such a metric is used to generally characterize a signal as "strong" or "weak." A transition between categories indicates potential change in signal source, which results in a forced decode. For radios which commonly utilize itinerant frequencies, which are generally co-located in a confined geographic area, it can be appreciated that a particular group of radios will most likely receive one of its own group members as a "strong" signal and most likely receive a radio of another group as a "weak" signal.

A source change may occur by a simple crossing of a single threshold value, or it may result from a more sophisticated determination. For example, it may be desirable to require two consecutive readings above or below a threshold. Hard limits and soft limits could also be defined such that crossing a hard limit immediately indicates a source change, but crossing a soft limit requires additional consecutive samples beyond the soft threshold.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of scanning a number of predetermined radio frequencies in a radio receiver comprising the steps of:
    a) monitoring for detection of a radio frequency (RF) carrier signal;
    b) detecting the presence of a flag marker associated with the RF carrier signal;
    c) monitoring for detection of a code associated with the RF carrier signal;
    d) storing a first signal measurement representing the signal strength of the RF carrier signal in a predetermined memory location;
    e) comparing a subsequent signal measurement of the RF carrier signal with the first signal measurement;
    f) repeating steps a) through c) and step e) in a scanning sequence;
    g) disallowing the receipt of received information in at least one iteration of the scanning sequence if steps a) through b) have been satisfied and the first signal measurement is substantially equal to any subsequent signal measurements; and
    h) allowing received information associated with the RF carrier signal to be received once the first signal measurement is substantially dissimilar to at least one subsequent signal measurement.

2. A method of scanning radio frequencies as in claim 1 wherein the code is a private line (PL) sub-audible tone.

3. A method of scanning radio frequencies as in claim 1 wherein the code is a digital private line (DPL) sub-audible tone.

4. A method as in claim 1 wherein the step of disallowing further includes the steps of:
    utilizing a channel marking counter for limiting a number of subsequent visits to a channel having a flag marker; and
    resetting the channel marking counter to a predetermined initial value.

5. A method of channel mark scanning a plurality of marked radio channels and unmarked radio channels in a radio receiver comprising the step of:
    receiving an RF carrier signal on an unmarked radio channel;
    decoding any subaudible signaling information on the unmarked radio channel;
    comparing the subaudible signaling information with preselected signaling information;
    marking the unmarked radio channel with a channel marking flag if there is no match with the preselected signaling information;
    measuring the RF signal strength of the RF carrier signal to provide a measured signal strength value;
    storing the measured signal strength value in a memory for the marked channel;
    measuring the signal strength of the RF carrier signal to provide a subsequent signal strength value upon any subsequent visits to the marked radio channel if it remains marked;
    comparing the measured signal strength value with the subsequent signal strength value for determining if there is an appreciable difference;
    unmarking the marked radio channel if an appreciable difference exists; and
    receiving any subaudible signaling information that may exist on the unmarked radio channel.

6. A method as in claim 5 further including the steps of:
    utilizing a channel marking counter for limiting a number of subsequent visits to a marked channel.

7. A method as in claim 5 further including the step of:
    resetting the channel marking counter to a predetermined initial value.

8. A method for scanning a predetermined number of frequencies in a radio receiver comprising the steps of:
    a) monitoring for detection of a radio frequency (RF) carrier signal;
    b) detecting the presence of a channel marking bit defining a marked channel associated with the RF carrier signal;
    c) measuring the signal strength of the RF carrier signal to provide a measured signal strength value if the radio channel is a marked channel;
    d) storing the measured signal strength value in a memory for the marked channel;
    e) measuring the signal strength of the RF carrier signal to provide a subsequent signal strength value upon any subsequent scanning visits to the marked radio channel if the channel marking bit remains on the channel;
    f) comparing the measured signal strength value with the subsequent signal strength value for determining if there is a substantial difference;
    g) unmarking the marked radio channel if a substantial difference exists in signal strength;
    h) receiving any subaudible signaling information that may exist; and
    i) permitting received information associated with the RF carrier, if detected, to be received.

* * * * *